US010134816B2

(12) United States Patent
Kim

(10) Patent No.: US 10,134,816 B2
(45) Date of Patent: Nov. 20, 2018

(54) ORGANIC LIGHT EMITTING DISPLAY

(71) Applicant: Samsung Display Co., Ltd., Yongin-si (KR)

(72) Inventor: Dong Gyu Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/007,940

(22) Filed: Jun. 13, 2018

(65) Prior Publication Data
US 2018/0294320 A1 Oct. 11, 2018

Related U.S. Application Data

(62) Division of application No. 14/560,695, filed on Dec. 4, 2014, now Pat. No. 10,008,551.

(30) Foreign Application Priority Data

Jul. 15, 2014 (KR) ........................ 10-2014-0089158

(51) Int. Cl.
G09F 13/04 (2006.01)
H01L 27/32 (2006.01)
G09G 3/3208 (2016.01)
H01L 51/52 (2006.01)
F21V 8/00 (2006.01)

(52) U.S. Cl.
CPC ........ *H01L 27/3227* (2013.01); *G02B 6/0011* (2013.01); *G09G 3/3208* (2013.01); *H01L 51/5271* (2013.01); *H01L 51/5275* (2013.01); *G09G 2320/029* (2013.01)

(58) Field of Classification Search
CPC .......................... H01L 27/3227; G09G 3/3208
See application file for complete search history.

(56) References Cited

U.S. PATENT DOCUMENTS

| 8,493,294 B2 * | 7/2013 | Yamashita | G09G 3/3233 313/500 |
| 8,791,931 B2 * | 7/2014 | Takuma | G09G 3/3225 345/207 |
| 9,047,819 B2 | 6/2015 | Kim et al. | |
| 2005/0040761 A1 | 2/2005 | Matsumoto | |

(Continued)

FOREIGN PATENT DOCUMENTS

| EP | 2159783 | 3/2010 |
| JP | 2010-078853 | 4/2010 |

(Continued)

OTHER PUBLICATIONS

Extended European Search Report dated Dec. 18, 2015, in European Patent Application No. 15155911.9.

(Continued)

*Primary Examiner* — Sean Gramling
(74) *Attorney, Agent, or Firm* — H.C. Park & Associates, PLC

(57) ABSTRACT

An organic light emitting display includes a first substrate including a display area and a non-display area, a plurality of dummy pixels positioned on at least a part of the non-display area of the first substrate, a light guide plate positioned on the plurality of dummy pixels, and a light sensor positioned at one side of the light guide plate.

7 Claims, 15 Drawing Sheets

(56) References Cited

U.S. PATENT DOCUMENTS

| | | | | |
|---|---|---|---|---|
| 2006/0119592 A1* | 6/2006 | Wang | .................... | G09G 3/3216 |
| | | | | 345/204 |
| 2009/0085859 A1* | 4/2009 | Song | .................... | G09G 3/3406 |
| | | | | 345/102 |
| 2011/0242074 A1* | 10/2011 | Bert | .................... | G09G 3/3208 |
| | | | | 345/207 |
| 2015/0029710 A1 | 1/2015 | Kim et al. | | |

FOREIGN PATENT DOCUMENTS

| | | |
|---|---|---|
| JP | 2011-043729 | 3/2011 |
| JP | 2011-221305 | 11/2011 |
| KR | 1020040037829 | 5/2004 |
| KR | 1020050009184 | 1/2005 |
| KR | 1020120019016 | 3/2012 |

OTHER PUBLICATIONS

Non-Final Office Action dated Jun. 26, 2017, in U.S. Appl. No. 14/560,695.
Final Office Action dated Dec. 5, 2017, in U.S. Appl. No. 14/560,695.
Notice of Allowance dated Feb. 23, 2018, in U.S. Appl. No. 14/560,695.

\* cited by examiner

ORGANIC LIGHT EMITTING DISPLAY

CROSS-REFERENCE TO RELATED APPLICATION

This application is a divisional of U.S. patent application Ser. No. 14/560,695, filed on Dec. 4, 2014, and claims priority from and the benefit under 35 U.S.C. § 119(a) of Korean Patent Application No. 10-2014-0089158, filed on Jul. 15, 2014, the entire disclosure of which is incorporated by reference herein for all purposes.

BACKGROUND

Field

The following disclosure relates to an organic light emitting display.

Discussion of the Background

An organic light emitting display device (OLED) is a display device that can display information, such as images, characters, and the like by using light generated through coupling of holes and electrons, which may be provided from an anode electrode and a cathode electrode, respectively, on an organic layer positioned between the anode electrode and the cathode electrode.

As a plurality of pixels (including the anode electrode, the cathode electrode, and the organic layer) included in the organic light emitting display device emits light, emission efficiency (cd/A) decreases and resistance increases. That is, as the plurality of pixels emits light, deterioration progresses. In particular, when images having a fixed pattern are repeatedly displayed in a specific display area of the organic light emitting display device, a plurality of pixels positioned in the specific display area has a higher deterioration progress speed than a plurality of pixels positioned in the other display area.

Since luminance of the plurality of pixels positioned in the specific display area, which rapidly deteriorates, is relatively lower than that of the plurality of pixels positioned in the other display area, the specific display area is viewed as a luminance speck.

SUMMARY

Exemplary embodiments of the present invention provide an organic light emitting display configured to correct deterioration of a plurality of active pixels positioned in a display area based on a deterioration state of a plurality of dummy pixels positioned in a non-display area.

Additional features of the invention will be set forth in the description which follows, and in part will be apparent from the description, or may be learned by practice of the invention.

Exemplary embodiments of the present invention provide an organic light emitting display. The organic light emitting display includes a first substrate including a display area and a non-display area; a plurality of dummy pixels positioned on at least a part of the non-display area of the first substrate; a light guide plate positioned on the plurality of dummy pixels; and a light sensor positioned at one side of the light guide plate.

Exemplary embodiments of the present invention provide an organic light emitting display. The organic light emitting display includes a first substrate including a display area and a non-display area; a plurality of dummy pixels positioned on at least a part of the non-display area of the first substrate; a light sensor positioned on the plurality of dummy pixels; and a moving unit configured to move the light sensor to be parallel to the plurality of dummy pixels.

Exemplary embodiments of the present invention provide an organic light emitting display. The organic light emitting display includes a first substrate including a display area and a non-display area; a plurality of dummy pixels positioned on at least a part of the non-display area of the first substrate; a guide member configured to guide light emitted from the plurality of dummy pixels; and a light sensor configured to receive the light guided by the guide member.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
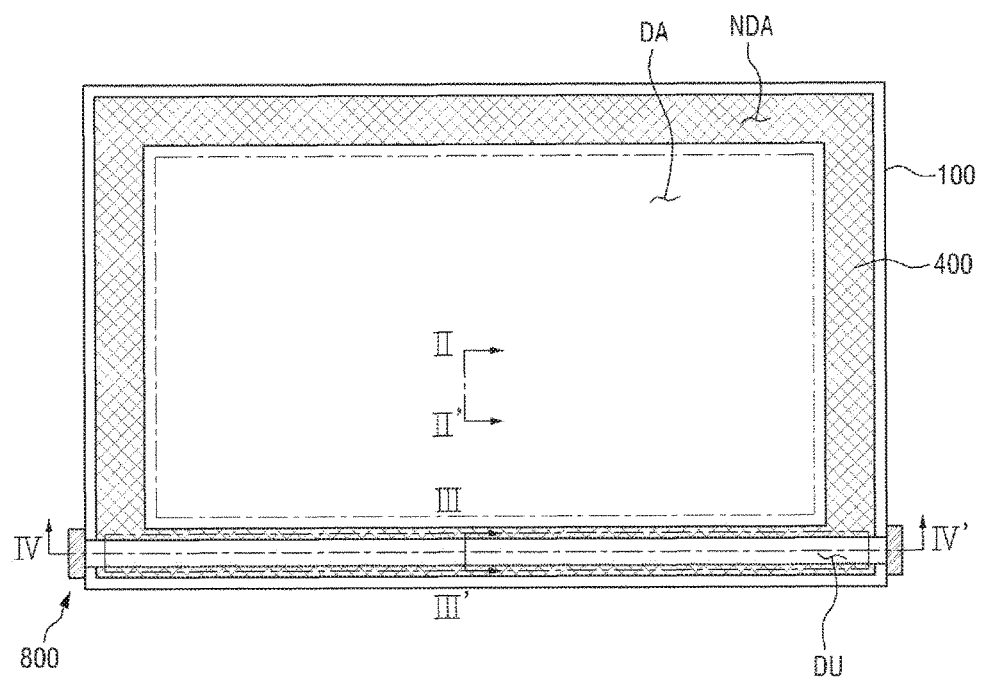
FIG. 1 is a plan view of an organic light emitting display according to an exemplary embodiment of the present invention.

Exemplary embodiments of the present invention will be described in more detail with reference to the accompanying drawings. These exemplary embodiments will be described in detail for those skilled in the art in order to practice the present invention. It should be appreciated that various exemplary embodiments of the present invention are different but do not have to be exclusive. For example, specific shapes, configurations, and characteristics described in an exemplary embodiment of the present invention may be implemented in another exemplary embodiment without departing from the spirit and the scope of the present invention. In addition, it should be understood that position and arrangement of individual components in each disclosed exemplary embodiment may be changed without departing from the spirit and the scope of the present invention. Therefore, a detailed description described below should not be construed as being restrictive. In addition, the scope of the present invention is defined only by the accompanying claims and their equivalents if appropriate. Similar reference numerals will be used to describe the same or similar functions throughout the accompanying drawings. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Exemplary embodiments are described herein with reference to cross-section illustrations that are schematic illustrations (and intermediate structures). Variations from the shapes of the illustrations, for example, of manufacturing techniques and/or tolerances, may be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, exemplary embodiments of the present invention will be described with reference to the accompanying drawings.

Figure 2:
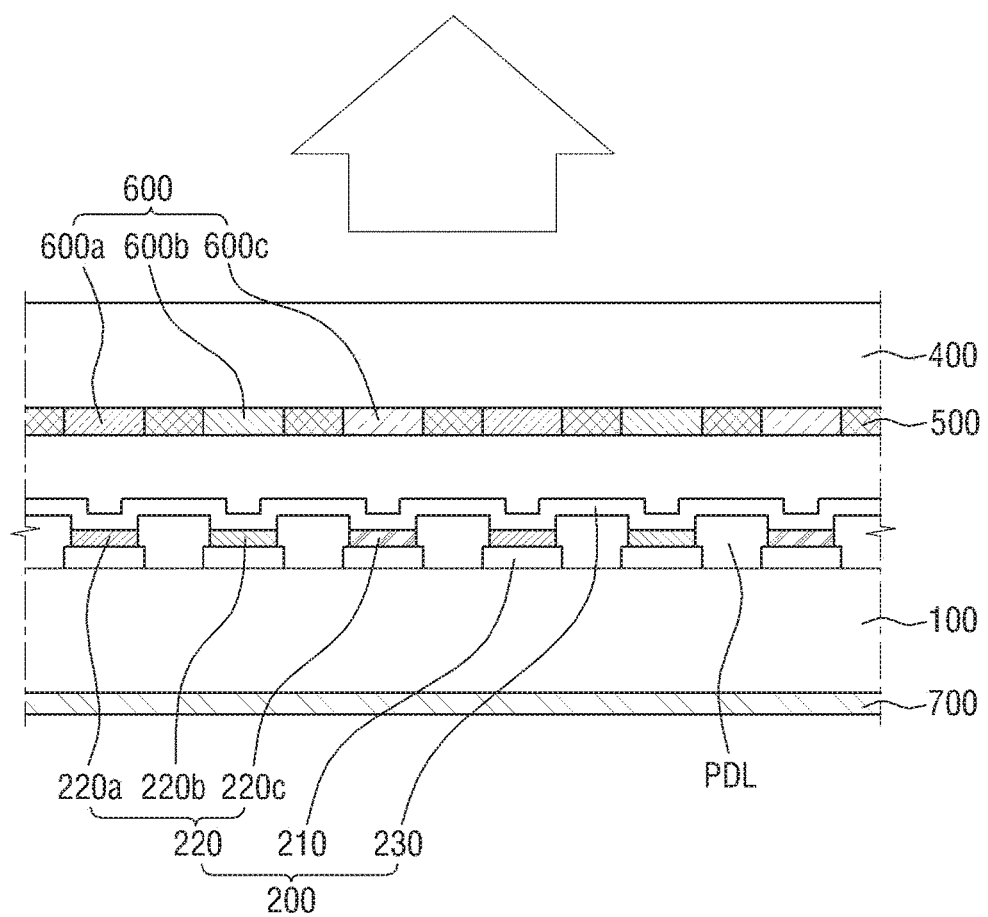
FIG. 2 is a cross-sectional view taken along line II-II' of FIG. 1.
Figure 3:
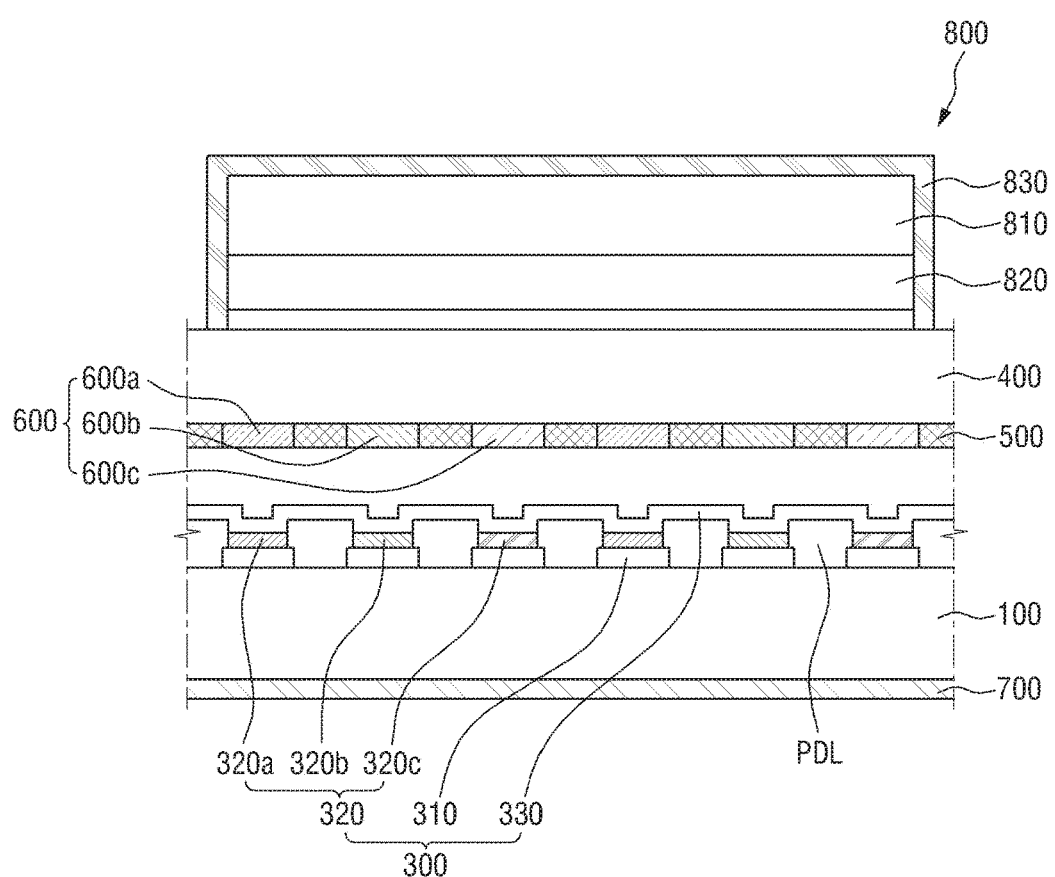
FIG. 3 is a cross-sectional view taken along line III-III' of FIG. 1.
Figure 4:
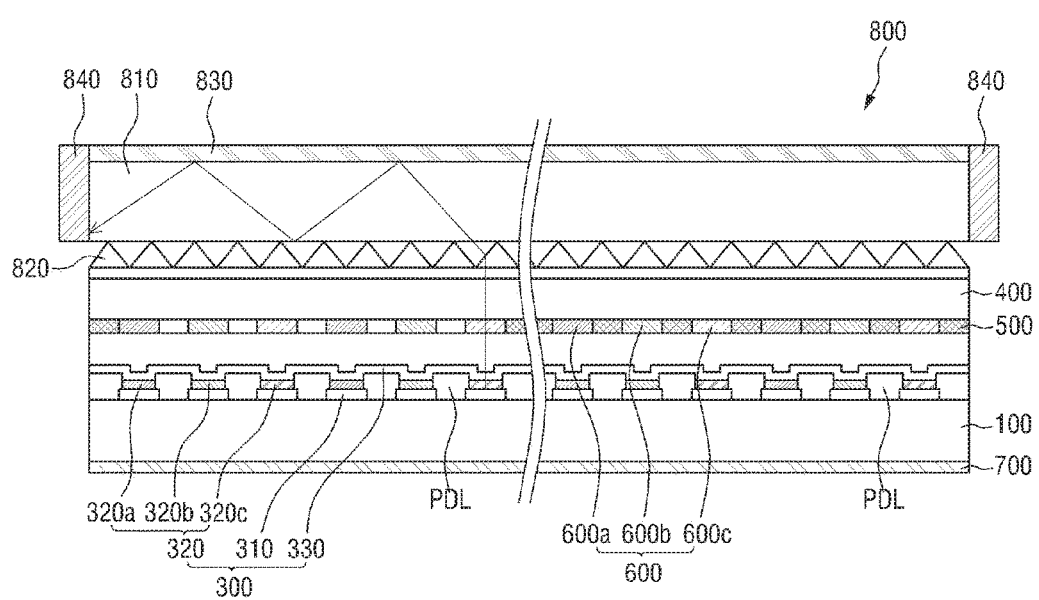
FIG. 4 is a cross-sectional view taken along line IV-IV' of FIG. 1.

FIG. 1 is a plan view of an organic light emitting display according to an exemplary embodiment of the present invention. FIG. 2 is a cross-sectional view taken along line II-II' of FIG. 1. FIG. 3 is a cross-sectional view taken along line III-III' of FIG. 1. FIG. 4 is a cross-sectional view taken along line IV-IV' of FIG. 1.

Referring to FIGS. 1 to 4, the organic light emitting display may include a first substrate 100, a plurality of active pixels 200, a plurality of dummy pixels 300, a second substrate 400, a black matrix 500, a plurality of color filters 600, a heat dissipation plate 700, and a light sensing member 800.

The first substrate 100 may include an insulating substrate. The insulating substrate may be made of a transparent glass material having transparent $SiO_2$ as a primary component. According to aspects of the invention, the insulating substrate may be made of an opaque material.

The first substrate 100 may include a flexible substrate, which may be subjected to a shape transformation process, such as rolling, folding, bending, or the like. The flexible substrate may be made of plastic, which may have high heat-resistance and durability, such as polyethyleneetherphthalate, polyethylene naphthalate, polycarbonate, polyarylate, polyetherimide, polyether sulfone, and polyimide. However, aspects of the invention are not limited thereto, such that various flexible materials may be used.

The first substrate 100 may have a rectangular parallelepiped shape. A shape of one surface of the first substrate 100 on which components are disposed may be described in more detail below. The heat dissipation plate 700 may be a rectangular shape. More specifically, one surface of the first substrate 100 may have a longer side than the other side. The longer side may be referred to as a first side, and the shorter side may be referred to as a second side.

Although not illustrated in the figure, the first substrate 100 may further include other structures formed or disposed on the insulating substrate. Examples of the other structures may include, without limitation, a wire, an electrode, an insulating film, and the like. When the display device is an active organic light emitting display device, the first substrate 100 may include a plurality of thin film transistors formed or disposed on the insulating substrate. The thin film transistor may include, without limitation, a gate electrode, a source electrode, and a drain electrode, and a semiconductor layer, which may be a channel region. The semiconductor layer may include, without limitation, an amorphous silicon, a microcrystal silicon, a polycrystal silicon, a monocrystal silicon, or a combination thereof. According to aspects of the invention, the semiconductor layer may be made of an oxide semiconductor. At least some drain electrodes of the plurality of thin film transistors may be electrically connected with a first electrode.

The first substrate 100 may include a display area DA and a non-display area NDA, which may be located adjacent to the display area DA. The display area DA may be surrounded by the non-display area NDA. The display area DA may be an area in which an image may be displayed. The non-display area NDA may be an area in which the image may not be displayed. Further, the display area DA may be located at a central area of the first substrate 100 and the non-display area NDA may be located at a peripheral area of the first substrate 100. Further, the display area DA may be an area in which a plurality of active pixels 200 is positioned and the non-display area NDA may be an area in which a plurality of dummy pixels 300 is positioned.

The non-display area NDA may include at least one dummy area DU. The dummy area DU may be an area in which the plurality of dummy pixels 300 may be positioned. According to aspects of the invention, the dummy area DU may be disposed at a location adjacent to the longer side of one surface of the first substrate 100. In more detail, the dummy area DU may be extended in one direction or a first direction to be parallel to the longer side or edge of the first substrate 100.

The plurality of active pixels 200 may be positioned on the display area DA of the first substrate 100 as illustrated in FIG. 2. Light emitted from the plurality of active pixels 200 may be displayed to a viewer. More specifically, the plurality of active pixels 200 may serve to display an image to be viewed by the viewer.

The plurality of active pixels 200 may include a plurality of active anodes 210, a plurality of active organic light emitting layer 220, and an active cathode 230.

The plurality of active anodes 210 may be positioned on the first substrate 100. The plurality of active anodes 210 may be directly or indirectly positioned on the first substrate 100. At least one insulating layer may be interposed between at least one of the active anodes 210 and the first substrate 100. The plurality of active anodes 210 may be spaced apart from each other at a predetermined interval on the first substrate. Some or all of the plurality of active anodes 210 may be made of the same material. The plurality of active anodes 210 may be made of a conductive material having a high work function. The plurality of active anodes 210 may be made of a material ITO, IZO, ZnO, or $In_2O_3$ or formed by a stacking layer thereof. Further, the plurality of active anodes 210 may further include a reflective layer, which may be made of, for example, Ag, Mg, Al, Pt, Pd, Au, Ni, Nd, Ir, Cr, Li, or Ca. The plurality of active anodes 210 may be subjected to various transformations including a transformation to have a structure of two layers or more by using two different materials or more, and the like among them.

A pixel defined layer PDL may insulate the plurality of active anodes 210, and may be positioned among the plurality of active anodes 210. The pixel defined layer PDL may expose center portions of the plurality of respective active anodes 210. The pixel defined layer PDL may include at least one organic material selected from benzo cyclo butene (BCB), polyimide (PI), polyamide (PA), an acrylic resin, and a phenol resin or an inorganic material such as silicon nitride, or the like. The pixel defined layer PDL may also be made of a photosensitizer, which may include a black pigment. According to aspects of the invention, the pixel defined layer PDL may serve as a light blocking member.

The plurality of active organic light emitting layers 220 may be positioned on the plurality of active anodes 210. In more detail, the plurality of respective active organic light emitting layers 220 may be positioned on the plurality of respective active anodes 210. More specifically, the active organic light emitting layer 220 and the active anode 210 may have a correspondence relationship of 1 to 1.

The plurality of active organic light emitting layers 220 may receive holes and electrons from the plurality of active anodes 210 and active cathodes 230, respectively. Further, the received holes and electrons may be coupled to each other to emit light. Light emitted from the plurality of active organic light emitting layers 220 may be viewed by the viewer.

The plurality of active organic light emitting layers 220 may include a first active organic light emitting layer 220a, a second active organic light emitting layer 220b, and a third active organic light emitting layer 220c.

The first active organic light emitting layer 220a may emit light of a first color, which may be a red color. For example, the first active organic light emitting layer 220a may be made of a high molecular material or a low molecular organic material of which a unique emission color is the first color (e.g., red color) or a high molecular/low molecular mixture material. According to aspects of the invention, the first active organic light emitting layer 220a may include a red host material and/or a red dopant material.

The second active organic light emitting layer 220b may emit light of a second color, which may be, a green color. For example, the second active organic light emitting layer 220b may be made of a high molecular material or a low molecular organic material of which a unique emission color is the second color (e.g., green color) or a high molecular/low molecular mixture material. According to aspects of the invention, the second active organic light emitting layer 220b may include a green host material and/or a green dopant material.

The third active organic light emitting layer 220c may emit light of a third color, which may be a blue color. For example, the third active organic light emitting layer 220c may be made of a high molecular material or a low molecular organic material of which a unique emission color is the third color (e.g., blue color) or a high molecular/low molecular mixture material. According to aspects of the invention, the third active organic light emitting layer 220c may include a blue host material and a blue dopant material.

As described above, the first active organic light emitting layer 220a, the second active organic light emitting layer 220b, and the third active organic light emitting layer 220c may emit the light of different colors. However, aspects of the invention are not limited thereto, such that all of the layers may emit light of the same color. Some or all of the first active organic light emitting layer 220a, the second active organic light emitting layer 220b, and the third active organic light emitting layer 220c may emit white light.

Further, although not illustrated in the figure, a hole-injection layer (HIL) and a hole-transporting layer (HTL) may be positioned between the plurality of active organic light emitting layers 220. The plurality of active anodes 210, an electron-transporting layer (ETL) and an electron-injection layer (EIL) may be positioned between the plurality of active organic light emitting layers 220 and the active cathode 230.

The active cathode 230 may be positioned on the plurality of active organic light emitting layers 220. The active cathode 230 may be made of a conductive material having a low work function. The active cathode 230 may be made of, for example, Ag, Mg, Al, Pt, Pd, Au, Ni, Nd, Ir, Cr, Li, or Ca. Further, the active cathode 230 may be semi-transparent.

As described above, since the plurality of active anodes 210 may be reflective and the active cathode 230 may be semi-transparent, the organic light emitting display may be a top-emission type organic light emitting display. More specifically, light generated from the plurality of active organic light emitting layers 220 may be emitted toward not the first substrate 100 but the second substrate 400 (e.g., an arrow direction of FIG. 2).

The plurality of dummy pixels 300 may be positioned on the dummy area DU in the non-display area NDA of the first substrate 100 as illustrated in FIGS. 3 and 4. Light emitted from the plurality of dummy pixels 300 may not be viewed by the viewer. The plurality of dummy pixels 300 may be spare pixels for correcting deterioration of the plurality of active pixels 200 positioned in the display area DA.

The plurality of dummy pixels 300 may include a plurality of dummy anodes 310, a plurality of dummy organic light emitting layers 320, and a dummy cathode 330.

The plurality of dummy anodes 310 may be substantially the same as the plurality of active nodes 210.

The plurality of dummy organic light emitting layers may include a first dummy organic light emitting layer 320a, a second dummy organic light emitting layer 320b, and a third dummy organic light emitting layer 320c. The first dummy organic light emitting layer 320a, the second dummy organic light emitting layer 320b, and the third dummy organic light emitting layer 320c may be substantially the same as the first active organic light emitting layer 220a, the second active organic light emitting layer 220b, and the third active organic light emitting layer 220c, respectively.

The dummy cathode 330 may be substantially the same as the active cathode 230.

More specifically, the plurality of dummy pixels 300 may be substantially the same as the plurality of active pixels 200. As described above, when the plurality of dummy pixels 300 and the plurality of active pixels 200 are substantially the same as each other, deterioration of the plurality of active pixels 200 may be more accurately corrected based on a deterioration state of the plurality of dummy pixels 300.

The second substrate 400 may be positioned on the first substrate 100. In more detail, the second substrate 400 may face the first substrate 100 with the plurality of active pixels 200 and the plurality of dummy pixels 300 interposed therebetween. The second substrate 400 may include an insulating substrate. Further, the second substrate 400 may include a flexible substrate, which may be subjected to one or more shape transformation processes, such as rolling, folding, bending, or the like. Further, the second substrate 400 may have the rectangular parallelepiped shape. According to aspects of the invention, the second substrate 400 may be made of the same material as the first substrate 100. Further, the second substrate 400 may have the same or corresponding shape as the first substrate 100.

The black matrix 500 may be positioned on a surface of the second substrate 400, which may be facing the plurality of active pixels 200 and the plurality of dummy pixels 300.

The black matrix 500 may be positioned on the non-display area NDA. However, aspects of the invention are not limited thereto, such that the black matrix 500 may be positioned even on the display area DA. The black matrix 500 may be made of a material capable of blocking light. The black matrix 500 may include a plurality of openings. The plurality of openings may correspond to the plurality of dummy pixels 300, respectively. The black matrix 500 may cover at least a portion or most of the non-display area NDA, but the plurality of dummy pixels 300 positioned on the dummy area DU of the non-display area NDA may be exposed.

The plurality of color filters 600 may be positioned in the plurality of openings. More specifically, the plurality of color filters 600 may correspond to the plurality of openings, respectively. The plurality of color filters 600 may filter the light emitted from the plurality of active pixels 200 and the plurality of dummy pixels 300 to allow only light having a specific wavelength to be transmitted.

The plurality of color filters 600 may include a first color filter 600a, a second color filter 600b, and a third color filter 600c. For example, the first color filter 600a may transmit the red light in the light emitted from the plurality of active pixels 200 and the plurality of dummy pixels 300, the second filter 600b may transmit the green light in the light emitted from the plurality of active pixels 200 and the plurality of dummy pixels 300, and the third color filter 600c may transmit the blue light in the light emitted from the plurality of active pixels 200 and the plurality of dummy pixels 300. However, aspects of the invention are not limited thereto, such that different colored lights may be emitted. According to aspects of the invention, the plurality of color filters 600 may be omitted.

The heat dissipation plate 700 may be disposed below or on the bottom of the first substrate 100. In more detail, the plurality of active pixels 200 and the plurality of dummy pixels 300 may be disposed above the heat dissipation plate 700 with the first substrate 100 interposed therebetween. The heat dissipation plate 700 may be made of a metallic material, but is not limited thereto and may be made of a carbon fiber, and the like.

The organic light emitting display may be a top-emission type organic light emitting display in which the light sensing member 800 is positioned on the top of the organic light emitting display as described below. The heat dissipation plate 700 may be disposed on the bottom of the first substrate 100 to discharge heat generated from the plurality of active pixels 200 and the plurality of dummy pixels 300 to the outside.

The light sensing member 800 may be positioned on the second substrate 400. In more detail, the light sensing member 800 may be positioned on the dummy area DU of the non-display area NDA. The light sensing member 800 may serve to measure the deterioration state of the plurality of dummy pixels 300 positioned in the non-display area NDA and correct the deterioration of the plurality of active pixels 200 positioned in the display area DA based on the measured deterioration state.

The light sensing member 800 may include a light guide plate 810, an optical sheet 820, a reflection sheet 830, and a light sensor 840.

The light guide plate 810 may be positioned on the second substrate 400. In more detail, the light guide plate 810 may be positioned on the plurality of dummy pixels 300 positioned on the dummy area DU of the non-display area NDA. The light guide plate 810 may have a shape corresponding to a shape of the dummy area DU. According to aspects of the invention, the light guide plate 810 may have a rectangular parallelepiped shape and the light guide plate 810 may extend in one direction to be parallel to one of the sides or edges of the first substrate 100. For example, the length of the light guide plate 810 when extended in a first direction may be substantially the same as the length of the longer side of the first substrate 100.

The light guide plate 810 may be made of the transparent material. According to aspects of the invention, the light guide plate 810 may be made of polymethyl-methacrylate (PMMA), but is not limited thereto and may be made of various transparent materials capable of guiding light. Further, the light guide plate 810 may be made of a rigid material, but is not limited thereto and may be made of the flexible material.

The optical sheet 820 may be interposed between the light guide plate 810 and the second substrate 400. The optical sheet 820 may change a path of the light emitted from the plurality of dummy pixels 300. Referring to the arrow illustrated in FIG. 4, the optical sheet 820 may change a path of light, which may be vertically incident in the bottom of the optical sheet 820 to be tilted to the top or the bottom of the light guide plate 810. As described above, the path-changed light is incident in the light guide plate 810 to be totally reflected in the light guide plate 810. According to aspects of the invention, the optical sheet 820 may be a prism sheet, but is not limited thereto.

The reflection sheet 830 may surround at least parts of the light guide plate 810 and the optical sheet 820. According to aspects of the invention, the light guide plate 810 and the optical sheet 820 may be fully surrounded by the reflection sheet 830, the second substrate 400, and the light sensor 840. The reflection sheet 830 may prevent or impede the light incident in the light guide plate 810 and the optical sheet 820 from being discharged to the outside.

The light sensor 840 may be positioned at one side of the light guide plate 810. In more detail, the light sensor 840 may be positioned on one end of the light guide plate 810. As illustrated in FIGS. 1 and 4, the number of the light sensors 840 may be two and two light sensors 840 may be positioned on both ends of the light guide plate 810. Further, the light sensors 840 may not overlap with the first substrate 100. However, aspects of the invention are not limited thereto, such that the light sensors may be disposed at different locations and the number of the light sensors may be less than two or more than two. The light sensor 840 may receive the light guided by the light guide plate 810. More specifically, the light sensor 840 may receive the light emitted from the plurality of dummy pixels 300 to detect the deterioration state of the plurality of dummy pixels 300.

As described above, the light sensing member 800 may serve to measure the deterioration state of the plurality of dummy pixels 300 positioned in the non-display area NDA and correct the deterioration of the plurality of active pixels 200 positioned in the display area DA based on the measured deterioration state. According to aspects of the invention, optical measurement of the plurality of active pixels 200 and the plurality of dummy pixels 300 may be measured before the light sensing member 800 is disposed on the second substrate 400 to secure correlation data between the plurality of active pixels 200 and the plurality of dummy pixels 300.

Thereafter, the light sensing member 800 may be disposed on the second substrate 400 and the plurality of dummy pixels 300 may be made to emit light. The plurality of dummy pixels 300 may continuously emit the light. More specifically, the plurality of dummy pixels 300 may maintain an on state even though the plurality of active pixels 200 is in an off state, such that the plurality of dummy pixels 300 may deteriorate earlier than the plurality of active pixels 200.

The plurality of dummy pixels 300 may include a red pixel emitting red light (corresponding to the aforementioned first dummy organic light emitting layer 320*a*), a green pixel emitting green light (corresponding to the aforementioned second dummy organic light emitting layer 320*b*), and a blue pixel emitting blue light (corresponding to the aforementioned third dummy organic light emitting layer 320*c*). The red pixel, the green pixel, and the blue pixel may alternatively emit the light. More specifically, when the plurality of dummy pixels 300 emits the light, only light of a single color (e.g., red, green, or blue) may be emitted. Further, even when the plurality of dummy pixels 300 emits the light of the single color, the light of the single color may be alternately emitted in order of low luminance, medium luminance, and high luminance.

Emission data of the plurality of dummy pixels 300 may be consistently stored by the light sensor 840. More specifically, the light sensor 840 may store red light/green light/blue light data at low luminance/medium luminance/high luminance with time in a lookup table. Data having predetermined luminance positioned between the low luminance and the medium luminance or between the medium luminance and the high luminance may be calculated by using interpolation. A deterioration curve of the plurality of dummy pixels 300 may be calculated by using the data stored in the lookup table.

The deterioration of the plurality of active pixels 200 may be corrected by using the data on the plurality of dummy pixels 300, which may deteriorate earlier than the plurality of active pixels 200. More specifically, since the plurality of dummy pixels 300 and the plurality of active pixels 200 have substantially the same structure, the deterioration of the plurality of active pixels 200 may be expected by using the deterioration data of the plurality of dummy pixels 300 and properly corrected.

Since the organic light emitting display is a top-emission type organic light emitting display, and the light sensing member 800 is disposed at the front side, the light emitted from the plurality of dummy pixels 300 may be efficiently sensed. More specifically, the light sensing member 800 may sufficiently sense low-gray light. As such, since a predetermined level or increased low-gray sensing sensitivity is ensured, analog driving of the organic light emitting display may be smoothly performed.

Further, the deterioration correction may be more precisely performed by avoiding the use of an internal light sensor having low light sensing accuracy, and instead using an external light sensor 840 having high light sensing accuracy. However, aspects of the invention are not limited thereto, such that the external light sensor 840 may be used with the internal light sensor.

Further, the number of used light sensors 840 may be minimized or reduced by using light guide members, such as the light guide plate 810 and the optical sheet 820, and as a result, costs required for providing the light sensor 840 may be reduced.

Figure 5:
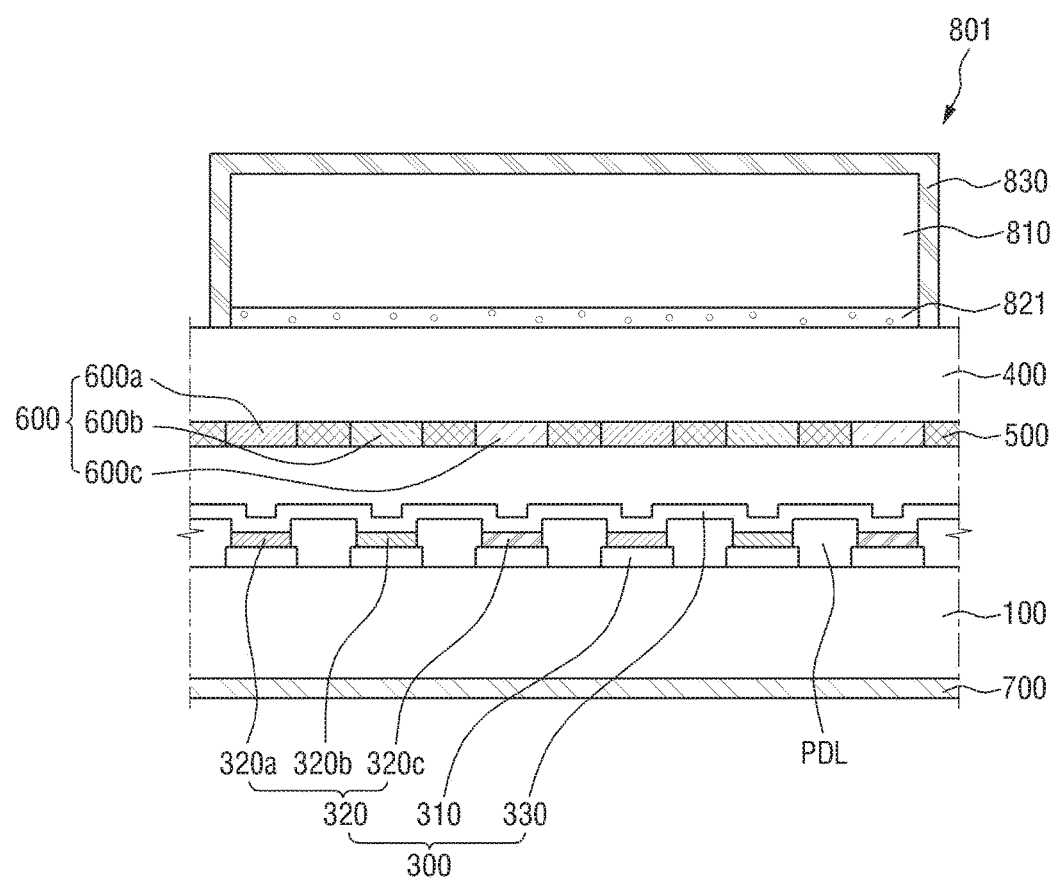
FIG. 5 and FIG. 6 are cross-sectional views of an organic light emitting display according to exemplary embodiments of the present invention.
Figure 6:
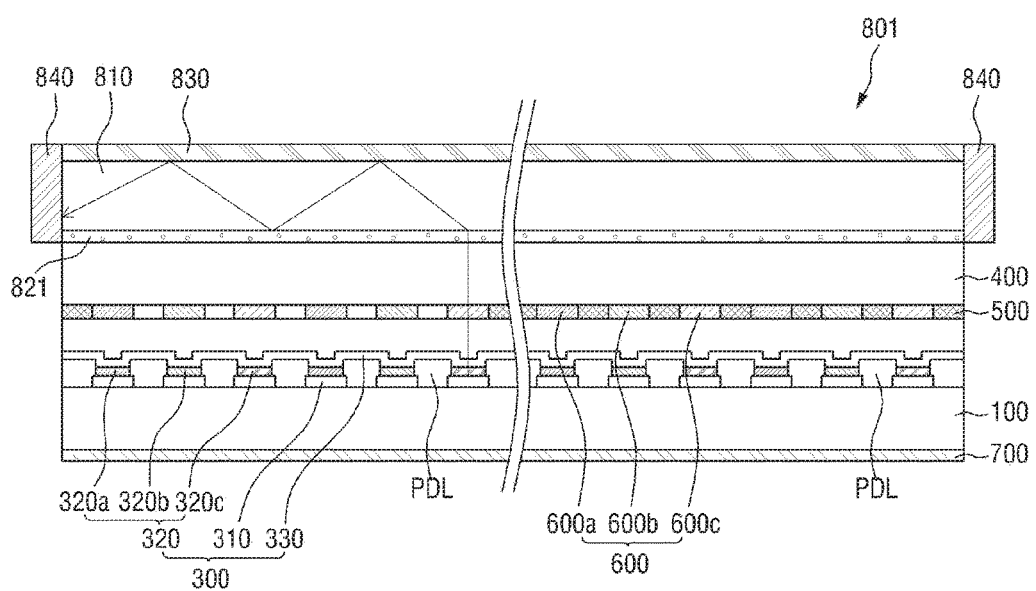

FIGS. 5 and 6 are cross-sectional views of an organic light emitting display according to exemplary embodiments of the present invention. For convenience of the description, substantially the same element as each element illustrated in the aforementioned drawing is represented by the same reference numeral, and the duplicated description is omitted.

Referring to FIGS. 5 and 6, a light sensing member 801 may include an optical sheet 821. In an example, the optical sheet 821 may be a diffusion sheet. According to aspects of the invention, the optical sheet 821 may include a plurality of beads, and the plurality of beads may substantially perform a light diffusion function, but is not limited thereto. As illustrated in arrow of FIG. 6, a path of the light emitted from the plurality of dummy pixels 300 is changed by the optical sheet 821, and the light may be transferred to the light sensor 840 through the light guide plate 810.

Figure 7:
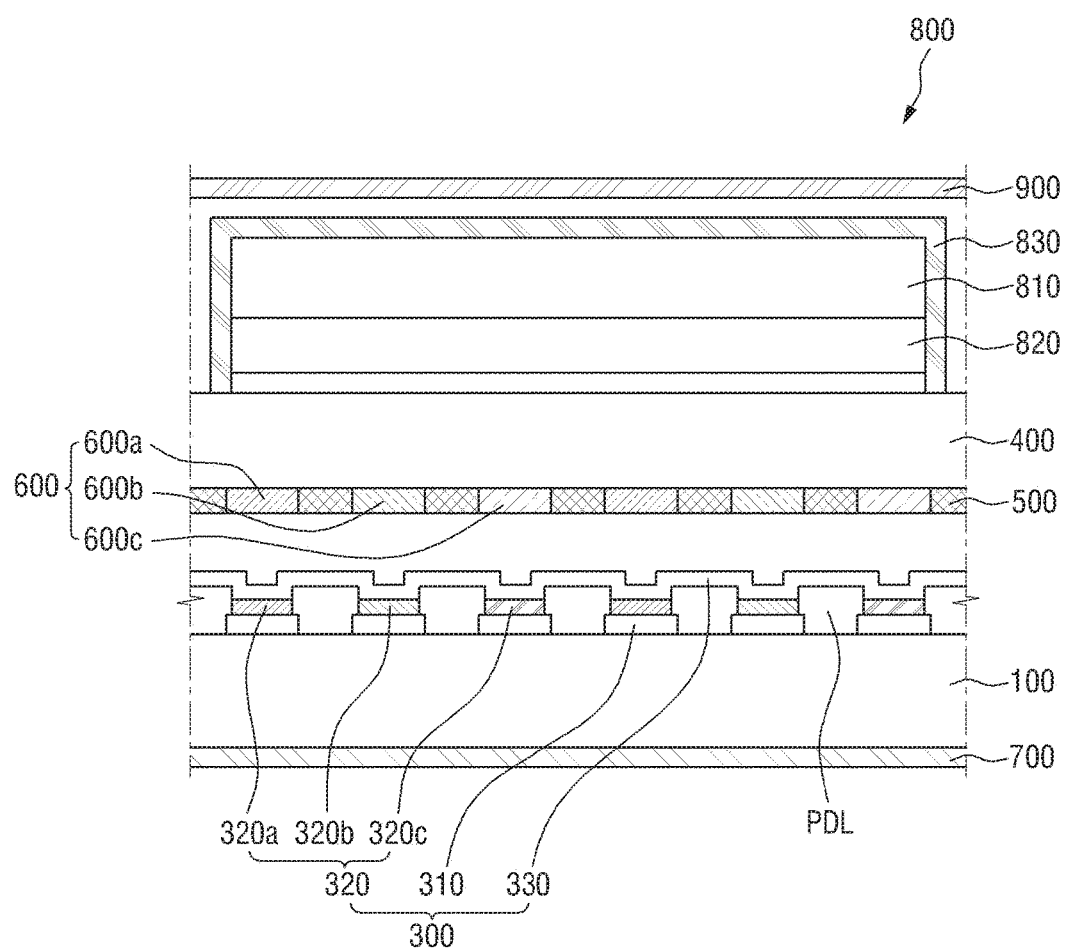
FIG. 7 and FIG. 8 are cross-sectional views of an organic light emitting display according to exemplary embodiments of the present invention.
Figure 8:
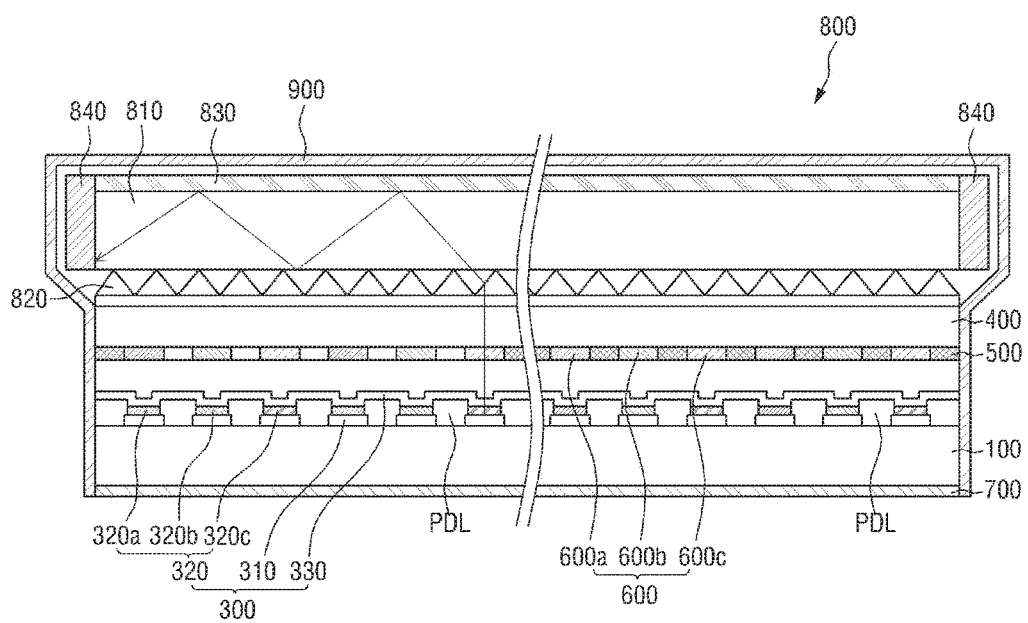

FIGS. 7 and 8 are cross-sectional views of an organic light emitting display according to exemplary embodiments of the present invention. For convenience of the description, substantially the same element as each element illustrated in the aforementioned drawing is represented by the same reference numeral, and the duplicated description is omitted.

Referring to FIGS. 7 and 8, the organic light emitting display may further include a light blocking member 900. The light blocking member 900 may be positioned on the light guide plate 810. According to aspects of the invention, the light blocking member 900 may be positioned on a non-display area (NDA). Further, the end of the light blocking member 900 may directly contact the end of the heat dissipation plate 700 as illustrated in FIG. 8. The light blocking member 900 may serve as a top chassis. For example, the light blocking member 900 may be made of a metallic material, but is not limited thereto and may be made of a plastic material, which may block the light.

Figure 9:
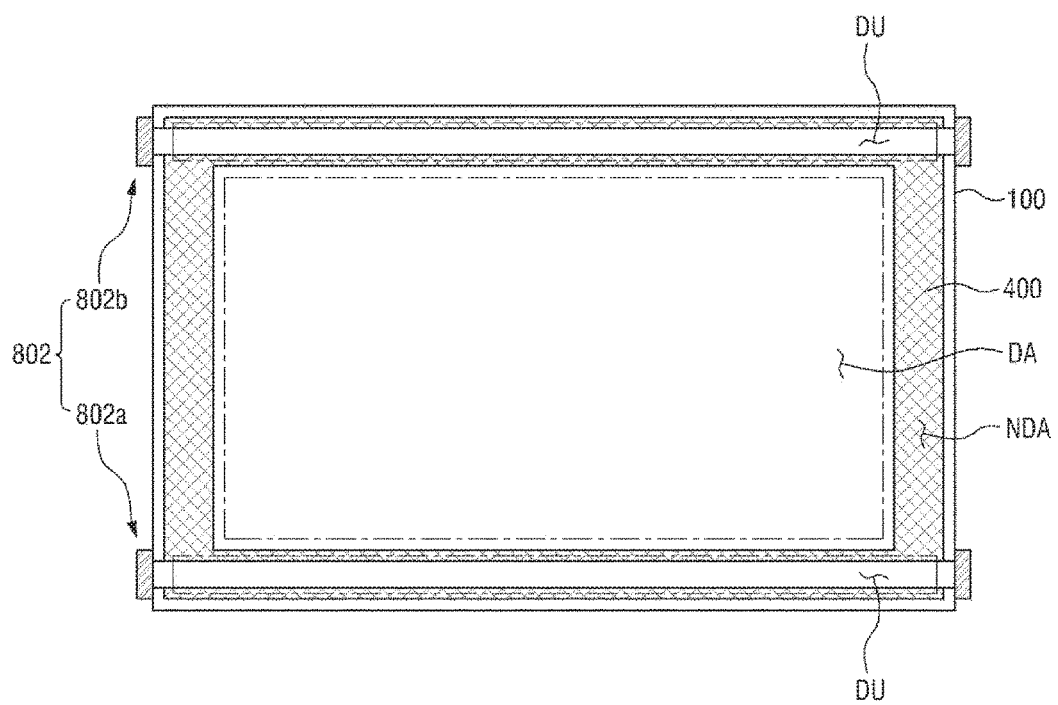
FIG. 9, FIG. 10, and FIG. 11 are plan views of an organic light emitting display according to exemplary embodiments of the present invention.

FIG. 9 is a plan view of the organic light emitting display according to an exemplary embodiment of the present invention. For convenience of the description, substantially the same element as each element illustrated in the aforementioned drawing is represented by the same reference numeral, and the duplicated description is omitted.

Referring to FIG. 9, the plurality of light sensing members 802 may be included as illustrated in FIGS. 1 to 4, and the plurality of light sensing members 802 may include a first light sensing member 802a and a second light sensing member 802b. The first light sensing member 802a and the second light sensing member 802b may be positioned to be adjacent to the longer sides of the first substrate 100. The two longer sides of the first substrate 100 may face one another.

Figure 10:
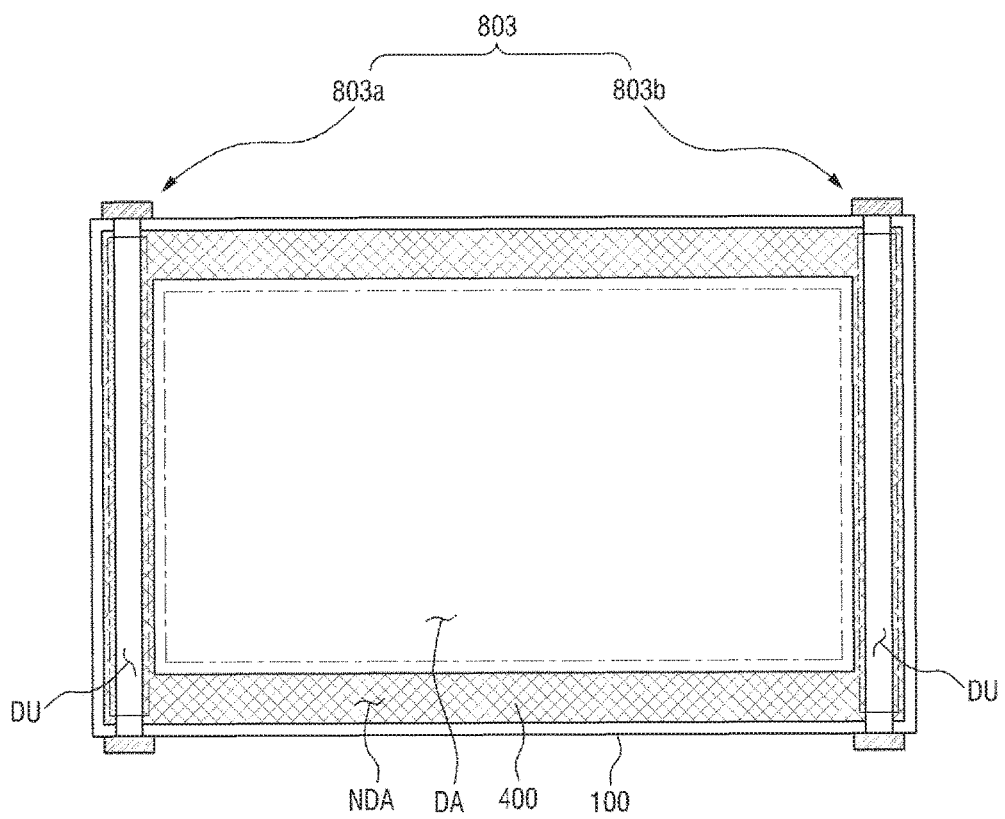

FIG. 10 is a plan view of the organic light emitting display according to an exemplary embodiment of the present invention. For convenience of the description, substantially the same element as each element illustrated in the aforementioned drawing is represented by the same reference numeral, and the duplicated description is omitted.

Referring to FIG. 10, a plurality of light sensing members 803 may be included as illustrated in FIGS. 1 to 4, and the plurality of light sensing members 803 may include a first light sensing member 803a and a second light sensing member 803b. The first light sensing member 803a and the second light sensing member 803b may be positioned to be adjacent to the shorter sides of the first substrate 100. The two shorter sides of the first substrate 100 may face one another. As illustrated in FIG. 10, it may be advantageous to dispose the plurality of light sensing members 803 at left and right sides of the panel, when organic light emitting displays having curved and bendable structures are implemented.

Figure 11:
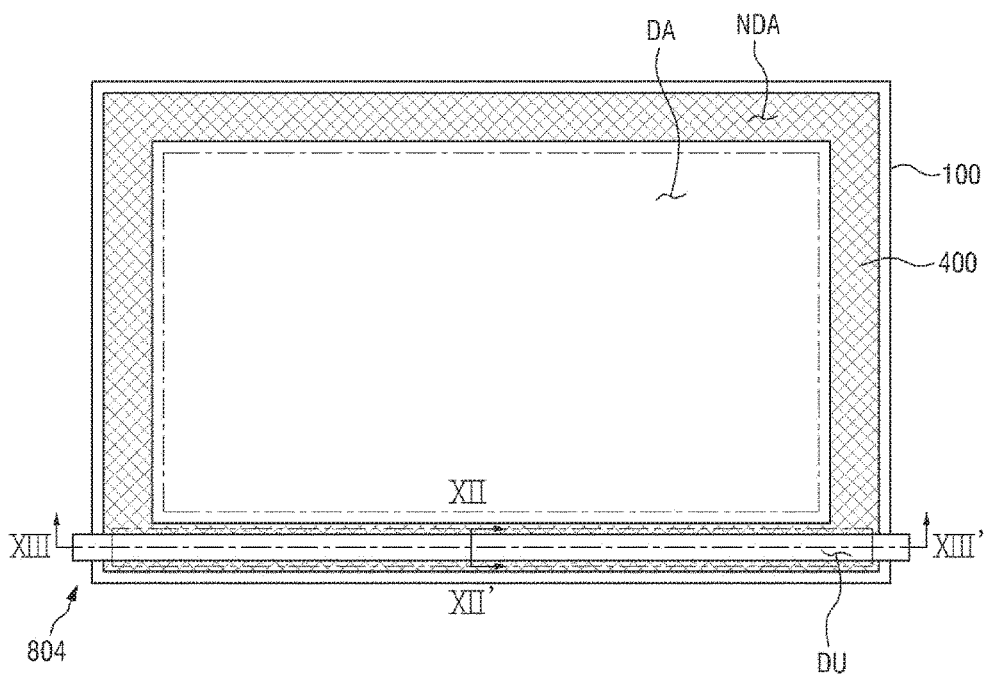
Figure 12:
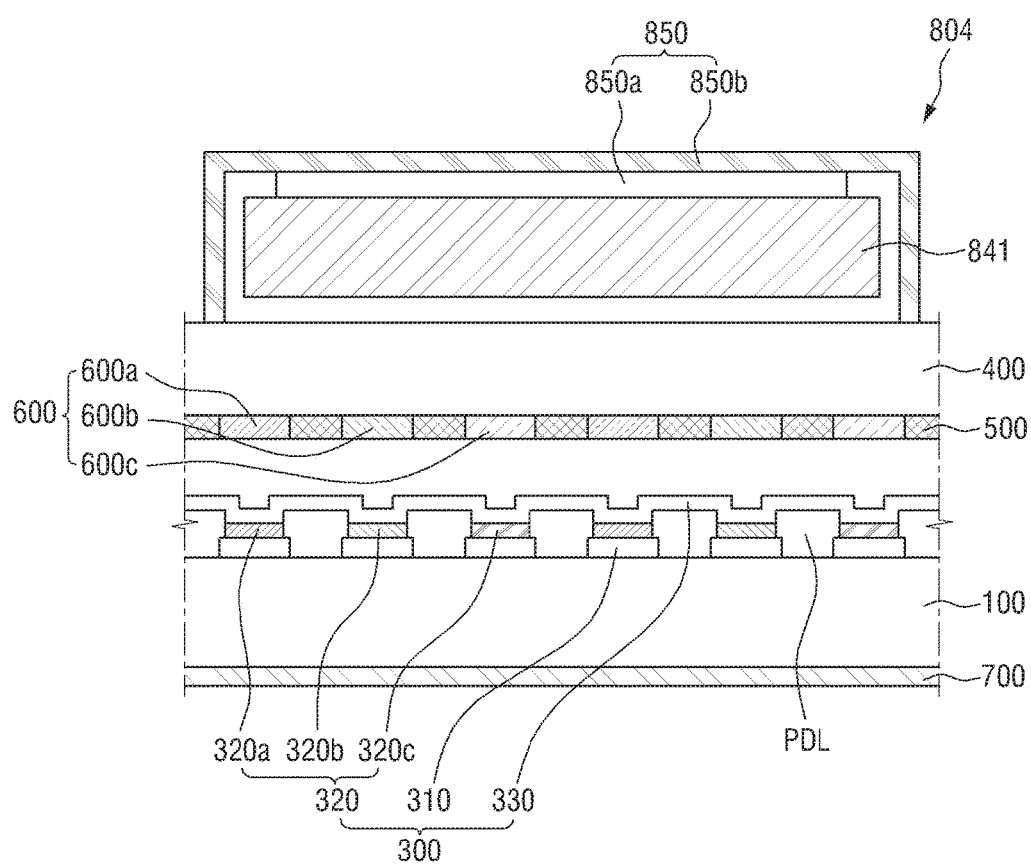
FIG. 12 is a cross-sectional view taken along line XII-XII' of FIG. 11.
Figure 13:
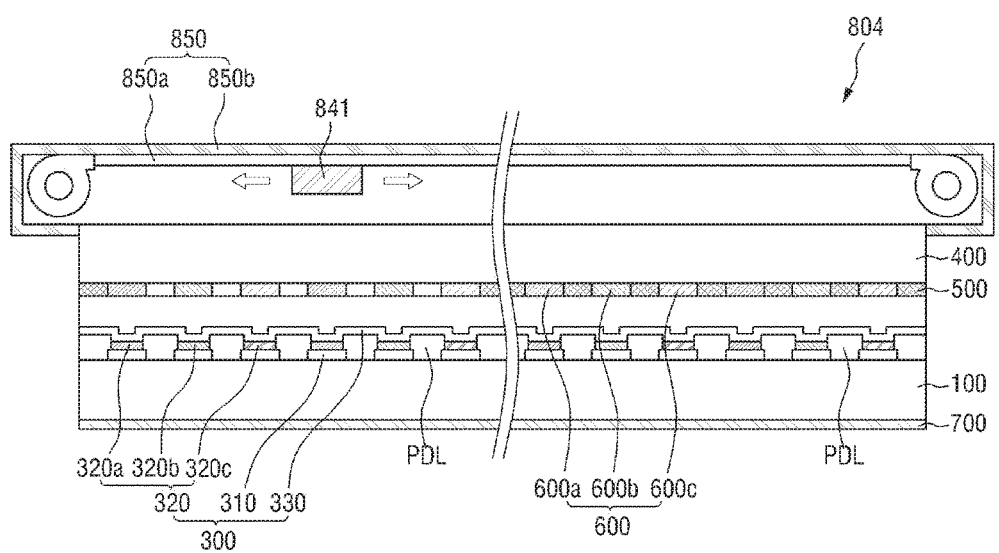
FIG. 13 is a cross-sectional view taken along line XIII-XIII' of FIG. 11.

FIG. 11 is a plan view of the organic light emitting display according to an exemplary embodiment of the present invention. FIG. 12 is a cross-sectional view taken along line XII-XII' of FIG. 11. FIG. 13 is a cross-sectional view taken along line XIII-XIII' of FIG. 11. For convenience of the description, substantially the same element as each element illustrated in the aforementioned drawing is represented by the same reference numeral, and the duplicated description is omitted.

Referring to FIGS. 11 to 13, a light sensing member 804 may include a light sensor 841 and a moving unit 850 moving the light sensor 841.

The light sensor 841 is substantially the same as the aforementioned light sensor 840, but the displacement structure and the shape thereof may be different. More specifically, the light sensor 841 is positioned on the plurality of dummy pixels 300 to directly receive the light emitted from the plurality of dummy pixels 300.

The moving unit 850 may be positioned on the second substrate 400. In more detail, the moving unit 850 may be extended in one direction to be parallel to one of the sides or edges of the first substrate 100. In an example, the moving unit 850 may extend in a first direction to be parallel to the longer sides of the first substrate 100 or extend in a second direction to be parallel to the shorter sides of the first substrate 100. The moving unit 850 may move or adjust the light sensor 841 to be parallel to the plurality of dummy pixels 300. For example, the moving unit 850 may move the light sensor 841 in a first direction and in a second direction, which may be opposite to the first direction. According to aspects of the invention, the moving unit 850 may reciprocate the light sensor 841 along the longer side of the first substrate 100.

The moving unit 850 may include a linear motor 850a and a receiving member 850b. The linear motor 850a may directly contact the light sensor 841 and may move or adjust the light sensor 841. The receiving member 850b surrounds the light sensor 841 and the linear motor 850a to prevent or impede the light from being discharged to the outside of the receiving member 850b.

According to aspects of the invention, the moving unit 850 instead of the light guide plate may be used to minimize or reduce the thickness of the organic light emitting display. Further, the light sensor 841 may move or adjust the upper portion of the plurality of dummy pixels 300 to evenly receive the light emitted from the plurality of dummy pixels 300.

Figure 14:
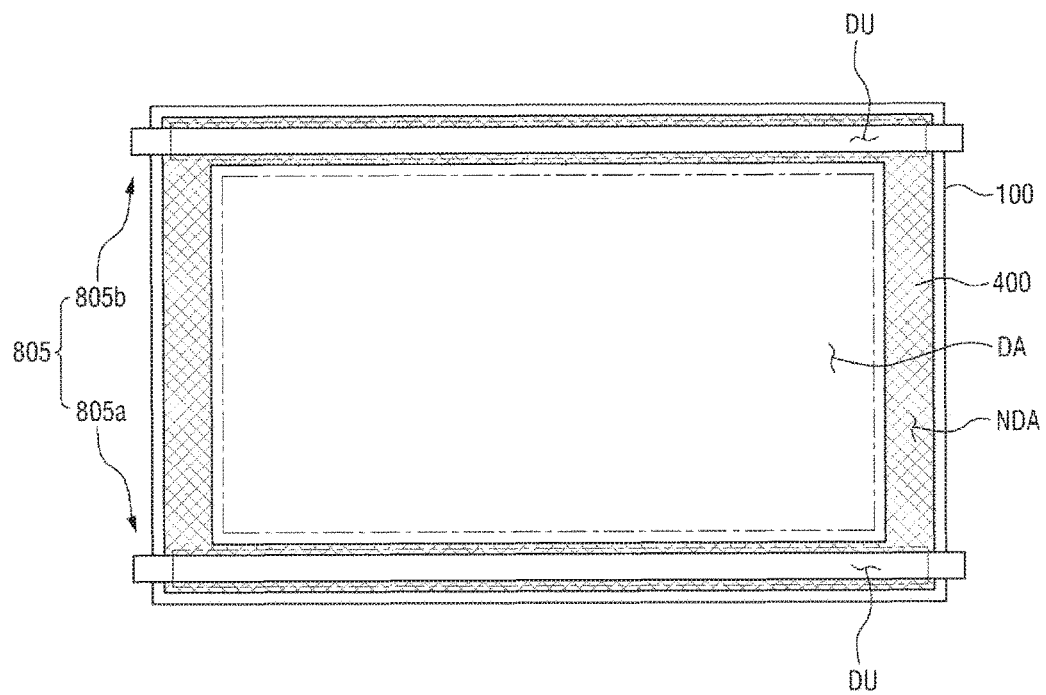
FIG. 14 and FIG. 15 are plan views of an organic light emitting display according to exemplary embodiments of the present invention.

FIG. 14 is a plan view of the organic light emitting display according to an exemplary embodiment of the present invention. For convenience of the description, substantially the same element as each element illustrated in the aforementioned drawing is represented by the same reference numeral, and the duplicated description is omitted.

Referring to FIG. 14, a plurality of light sensing members 805 may be included as illustrated in FIGS. 11 to 13, and the plurality of light sensing members 805 may include a first light sensing member 805a and a second light sensing member 805b. The first light sensing member 805a and the second light sensing member 805b may be positioned to be adjacent to the longer sides of the first substrate 100. The two longer sides of the first substrate 100 may face one another.

Figure 15:
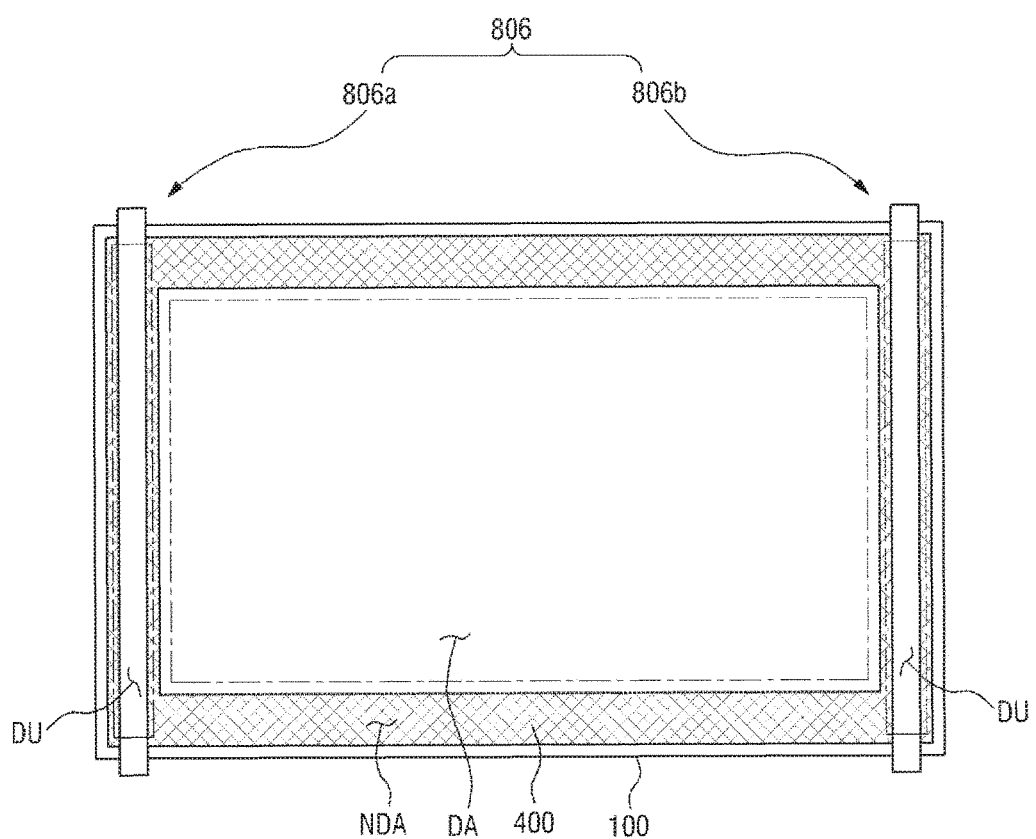

FIG. 15 is a plan view of the organic light emitting display according to an exemplary embodiment of the present invention. For convenience of the description, substantially the same element as each element illustrated in the aforementioned drawing is represented by the same reference numeral, and the duplicated description is omitted.

Referring to FIG. 15, a plurality of light sensing members 806 may be included as illustrated in FIGS. 11 to 13, and the plurality of light sensing members 806 may include a first light sensing member 806a and a second light sensing member 806b. The first light sensing member 806a and the second light sensing member 806*b* may be positioned to be adjacent to the shorter sides of the first substrate 100. The two shorter sides of the first substrate 100 may face one another. As illustrated in FIG. 15, it may be advantageous to dispose the plurality of light sensing members 806 at left and right sides of the panel, when organic light emitting displays having curved and bendable structures are implemented.

The foregoing is illustrative of the present invention and is not to be construed as limiting thereof. Although a few exemplary embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. An organic light emitting display, comprising:
    a first substrate including a display area and a non-display area;
    a plurality of dummy pixels positioned on at least a part of the non-display area of the first substrate;
    a light sensor positioned on the plurality of dummy pixels; and
    a moving unit configured to move the light sensor to be parallel to the plurality of dummy pixels.

2. The organic light emitting display of claim 1, wherein the moving unit comprises:
    a linear motor configured to move the light sensor, and
    a receiving member configured to surround at least a portion of the light sensor and the linear motor.

3. The organic light emitting display of claim 1, wherein:
    a surface of the first substrate facing the plurality of dummy pixels has a rectangular shape, and
    the moving unit extends in a direction to be parallel to an edge of the first substrate.

4. The organic light emitting display of claim 3, wherein the light sensor is configured to move in a first direction and a second direction opposite to the first direction.

5. The organic light emitting display of claim 1, further comprising:
    a second substrate positioned between the plurality of dummy pixels and the light sensor; and
    a black matrix positioned on a surface of the second substrate facing the plurality of dummy pixels, the black matrix including openings corresponding to the plurality of dummy pixels.

6. The organic light emitting display of claim 1, further comprising:
    a plurality of active pixels positioned on the display area of the first substrate,
    wherein the plurality of respective dummy pixels has substantially the same structure as the plurality of respective active pixels.

7. The organic light emitting display of claim 1, further comprising:
    a heat dissipation plate facing the plurality of dummy pixels with the first substrate interposed therebetween,
    wherein the heat dissipation plate is positioned on a surface of the first substrate.

* * * * *